United States Patent
Je et al.

(10) Patent No.: US 12,024,423 B2
(45) Date of Patent: **\*Jul. 2, 2024**

(54) METHOD FOR FABRICATING MICRO- OR NANOWIRE AT PREDETERMINED POSITION OF OBJECT USING MICRO- OR NANOPIPETTE

(71) Applicant: POSTECH Research and Business Development Foundation, Pohang-si (KR)

(72) Inventors: Jung Ho Je, Pohang-si (KR); Seung Soo Oh, Pohang-si (KR); Un Yang, Pohang-si (KR); Moon Jung Yong, Incheon (KR); Byung Hwa Kang, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 268 days.

This patent is subject to a terminal disclaimer.

(21) Appl. No.: 17/587,922

(22) Filed: Jan. 28, 2022

(65) Prior Publication Data

US 2022/0242726 A1 Aug. 4, 2022

Related U.S. Application Data

(63) Continuation-in-part of application No. 17/306,220, filed on May 3, 2021.

(30) Foreign Application Priority Data

Feb. 1, 2021 (KR) .................. 10-2021-0014231
Jan. 28, 2022 (KR) .................. 10-2022-0013230

(51) Int. Cl.
| | | |
|---|---|---|
| *B82B 3/00* | (2006.01) | |
| *B82Y 20/00* | (2011.01) | |
| *B82Y 40/00* | (2011.01) | |

(52) U.S. Cl.
CPC ............ *B82B 3/0023* (2013.01); *B82Y 20/00* (2013.01); *B82Y 40/00* (2013.01)

(58) Field of Classification Search
CPC ........................ B29D 11/00663; D01D 5/06
See application file for complete search history.

(56) References Cited

U.S. PATENT DOCUMENTS

| | | | |
|---|---|---|---|
| 11,911,983 B2 * | 2/2024 | Je ................... | B29D 11/00663 |
| 2016/0049214 A1 | 2/2016 | Reece | |
| 2020/0103256 A1 | 4/2020 | Kim et al. | |

FOREIGN PATENT DOCUMENTS

| | | | |
|---|---|---|---|
| KR | 20110086253 | * | 7/2011 |
| KR | 20130057546 | | 6/2013 |

(Continued)

OTHER PUBLICATIONS

An, et al., Nanomeniscus-induced delivery of liquid solutions for diverse nanofiber fabrication, Nano Convergence, 2015, vol. 2, No. 13.

(Continued)

*Primary Examiner* — Nathan T Leong
(74) *Attorney, Agent, or Firm* — CANTOR COLBURN LLP

(57) ABSTRACT

Provided is a method of fabricating a micro/nanowire having a nanometer- to micrometer-sized diameter at predetermined positions on an object. The method comprises: preparing a micro/nanopipette having a tip with an inner diameter ($d_{pt}$) which is substantially the same as the diameter of the micro/nanowire to be fabricated; filling the micro/nanopipette with a solution containing a micro/nanowire-forming material; bringing the solution into contact with the object (Continued)

through the tip of the micro/nanopipette; and pulling the micro/nanopipette apart from the object at a pulling speed lower than or equal to a predetermined critical pulling speed ($v_c$) to fabricate a micro/nanowire having substantially the same diameter as the inner diameter of the micro/nanopipette tip ($d_{pt}$). The critical pulling speed ($v_c$) is defined by a maximum limit of the pulling speed at which the micro/nanowire to be fabricated has the same diameter as the inner diameter of the micro/nanopipette tip ($d_{pt}$).

15 Claims, 12 Drawing Sheets

(56) References Cited

FOREIGN PATENT DOCUMENTS

| KR | 20140070183 | 6/2014 |
|---|---|---|
| KR | 101526324 | 6/2015 |
| KR | 101583739 | 1/2016 |
| KR | 20160000281 | 1/2016 |
| KR | 20160056485 | 5/2016 |

OTHER PUBLICATIONS

Goehring, et al., Solidification and Ordering during Directional Drying of a Colloidal Dispersion, Langmuir, 2010, vol. 26, No. 12, pp. 9269-9275.
Han, et al., Stimuli-Responsive Self-Immolative Polymer Nanofiber Membranes Formed by Coaxial Electrospinning, ACS Applied Materials & Interfaces, 2017, vol. 9, pp. 11858-11865.
Harfenist, et al., Direct Drawing of Suspended Filamentary Micro- and Nanostructures from Liquid Polymers, Nano Letters, 2004, vol. 4, No. 10, pp. 1931-1937.
Kang, et al., A Robust Highly Aligned DNA Nanowire Array-Enabled Lithography for Graphene Nanoribbon Transistors, Nano letters, 2015, vol. 15, pp. 7913-7920.
Kim, et al., Three-Dimensional Writing of Conducting Polymer Nanowire Arrays by Meniscus-Guided Polymerization, Advanced Materials, 2011, vol. 23, pp. 1968-1970.
Lee, et al., Quantitative Probing of Cu2+ Ions Naturally Present in Single Living Cells, Advanced Materials, 2016, vol. 28, pp. 4071-4076.
Li, et al., Drying Dip-Coated Colloidal Films, Langmuir, 2012, vol. 28, pp. 200-208.
Long, et al., DNA optical nanofibers: preparation and characterization, Optics express, Jul. 2012, vol. 20, No. 16, pp. 18188-18193.
Min, et al., Large-scale organic nanowire lithography and electronics, Nature communications, 2013, pp. 1-9.
Nagarajan, et al., Overview of Protein-Based Biopolymers for Biomedical Application, Macromolecular Chemistry and Physics, 2019, vol. 220, 1900126.
P. J. Flory et al. "Treatment of Intrinsic Viscosities", J. Am. Chem. Soc., 1951, vol. 73, 1904-1908.
Park, et al., 3D printed structures for delivery of biomolecules and cells: tissue repair and regeneration, Journal of Materials Chemistry B, 2016, vol. 4, pp. 7521-7539.
Ralph H. Colby et al. "Melt Viscosity-Molecular Weight Relationship for Linear Polymers", Macromolecules, 1987, vol. 20, No. 9, pp. 2226-2237.
Shahriar, et al., Electrospinning Nanofibers for Therapeutics Delivery, Nanomaterials, 2019, vol. 9.
Tuniz, et al., Interfacing optical fibers with plasmonic nanoconcentrators, Nanophotonics, 2018, vol. 7, No. 7, pp. 1279-1298.
Yan, et al., Nanowire-based single-cell endoscopy, Nature Nanotechnology, Mar. 2012, vol. 7, pp. 191-196.
Yoo, et al., A Stretchable Nanowire UV-Vis-NIR Photodetector with High Performance, Advanced Materials, 2015.
Zhang, et al., Electrospinning design of functional nanostructures for biosensor applications, Journal of Materials Chemistry B, 2017, vol. 5, pp. 1699-1711.
International Search Report—PCT/KR2022/001602 dated May 20, 2022.

* cited by examiner

< Non-confined Growth >

Non-confined Growth

Confined Growth

30 mer ssDNA

METHOD FOR FABRICATING MICRO- OR NANOWIRE AT PREDETERMINED POSITION OF OBJECT USING MICRO- OR NANOPIPETTE

FIELD OF THE INVENTION

The present disclosure relates to a method of fabricating a micro- or nanowire (hereinafter referred to as "micro/nano wire") at predetermined position of an object using a micro- or nanopipette (hereinafter referred to as "micro/nano pipette" or "pipette"), and more particularly, to a method of fabricating a micro/nano wire at predetermined position of an object using a micro/nano pipette having a tip with a nanometer- to micrometer-sized diameter.

BACKGROUND

Micro- and nanotechnology refers to a technology of fabricating devices or systems exhibiting novel or improved physical/chemical/biological properties by manipulating, analyzing, and regulating materials in the range of several nanometers to several micrometers. In particular, one-dimensional linear structure of micro or nano wires has various advantages. First of all, the micro- or nano wires are advantageous for material transfer or detection of target materials because they facilitate material exchange through their large surface areas. In addition, the micro- or nano wires may be used to realize devices with desired geometry by fabricating specific linear patterns and frameworks or by establishing connection between device elements. Due to these advantages, micro/nano wires are used in very diverse fields, including optical communication (refer to Nanophotonics, 7, 1279-1298 (2018), and Optics express, 20, 18188-18193 (2012)), drug delivery (refer to Nanomaterials, 9, 532. (2019), and ACS applied materials & interfaces, 9, 11858-11865 (2017)), lithography (refer to Nano letters, 15, 7913-7920 (2015)), optical sensors (refer to Advanced Materials, 27(10), 1712-1717 (2015)), and biosensors (refer to Journal of Materials Chemistry B, 5, 1699-1711 (2017)).

In the field of optical communication, various studies for optical connection at nano scale have been conducted. For example, a method of directly growing polymer nanowire between optical fibers was suggested (refer to Optics express, 20, 18188-18193 (2012)). However, since the nanowire fabrication of polymer materials is greatly influenced by the concentration of their solution and the given environments, it is difficult to fabricate polymer nanowires having uniform diameters and densities. In polymer nanowire fabrication by conventional methods, therefore, large light loss at the junctions between the optical fibers and the nanowires was inevitable. For this reason, in order to minimize the light loss, a new nanowire fabrication technology is required which is precisely controllable while being less affected by the surrounding environment.

For micro/nano wire materials which are used in biomedical and tissue engineering fields, sufficient physical properties, biocompatibility, and biodegradability need to be taken into consideration (refer to Journal of Materials Chemistry B, 4, 7521-7539 (2016)). Biopolymers such as nucleic acids and proteins, which are universal building blocks of living organisms, have biocompatibility and biodegradability, and thus are currently used as core materials in the fields such as biomedical and biological tissue engineering (refer to Macromolecular Chemistry and Physics, 220, 1900126 (2019)). In addition, since a specific biopolymer material may induce desired in vivo responses or control physicochemical properties by binding functional molecules thereto, it is important to broaden the range of biopolymer materials for the fabrication of micro/nano wires. However, biopolymers have various properties depending on their type, and are greatly affected by environmental factors (temperature, humidity, etc.) such as thermoelasticity and hygroscopicity. For this reason, it is furthermore difficult to fabricate three-dimensional structures of biopolymer micro/nano wires due to limited physical properties of biopolymers in their fabrication processes (refer to Macromolecular Chemistry and Physics, 220, 1900126 (2019)). Therefore, for the fabrication of biopolymer micro- or nanowires, it is becoming important to develop an optimal processing method which is less affected by the type of their materials or the external environments.

One technology for fabricating polymer nanowires is an electrospinning-based method which is able to eject a solution through a nozzle by a high voltage electric field between the nozzle and a collector (refer to Nature communications, 4, 1-9 (2013)). In this nanowire fabricating process, the solution is released very quickly by the electric field, which permits to quickly print a desired nanowire pattern over a large area by controlling the movement of the substrate. However, materials that may be used in this method are limited to electrically charged polymers, and it is difficult for this method to implement precise positioning and three-dimensional (3D) printing on a flat surface. For these reasons, the application of this method is very limited to the fabrication of various device elements.

Another technology for fabricating polymer nanowires is a probe-based drawing method (refer to Nano Letters, 4, 1931-1937 (2004)). This method may fabricate nanowires by forming a high-concentration polymer droplet at a probe tip, bringing the polymer droplet into contact with a target, and then stretching the polymer droplet while controlling the position of the probe. However, since the stretching of the polymer varies depending on the concentration of the polymer solution and the surrounding environment, it is difficult to fabricate 3D nanowire having uniform characteristics.

As still another technology for fabricating a three-dimensional polymer nanowire, there is a meniscus-guiding method (Advanced Materials, 23, 1968-1970 (2011)). By this method, a nanowire is fabricated by bringing a micropipette filled with a polymer solution into contact with a substrate and then pulling the pipette at high speeds. In the process of rapidly pulling the pipette, a meniscus is formed between the tip of the pipette and the nanowire, and at this time, the meniscus solution is stretched depending on the pulling speed of the pipette, thus determining the diameter of the nanowire. Since it is possible for this method to adjust the position, shape, and diameter of the nanowire, this method has high accuracy and is advantageous for fabricating various 3D nano devices. However, there is a limit to regulating the diameter of the nanowire, because the stretching degree of the meniscus varies depending on the concentration and physical properties of the polymer, temperature and humidity of the surrounding environment, and the like.

For another example of a method of fabricating a nanowire using a meniscus, reference may be made to Korean Patent No. 10-1583739 (Jan. 4, 2016) (entitled "STRETCHABLE NANOWIRE COMPRISING PbS QUANTUM DOT-POLY(3-HEXYLTHIOPEHENE) AND PHOTODETECTOR CAPABLE OF UV-VISIBLE-NIR PHOTORESPONSE AND PHOTODETECTOR ARRAY COMPRISING THE SAME") (hereinafter referred to as "Prior Art 1") (refer to FIG. 1).

Prior Art 1 discloses a method of fabricating a nanowire having a nanometer-sized diameter using a pipette having a tip with a micrometer-sized diameter (refer to FIG. 1). This method includes: preparing a mixture solution containing PbS quantum dots and poly(3-hexylthiophene); filling a pipette with the mixture solution; forming a meniscus of the mixture solution on a substrate using the pipette; and fabricating a column-shaped nanowire by pulling the pipette, while exposing the mixture solution to air.

Here, since the tip diameter of the pipette is on the order of micrometers and the nanowire diameter to be fabricated is on the order of nanometers, it is essential to form a meniscus of the mixture solution at the pipette tip. Regarding this essential requirement, Prior Art 1 discloses that the diameter and length of the nanowire may be adjusted by regulating the pulling speed of the pipette and a pulling distance of the pipette.

However, according to Prior Art 1, it is difficult to obtain a nanowire having a designed diameter, and Prior Art 1 does not describe how to determine the pulling speed of the pipette in order to obtain the designed diameter.

For another example of a method of fabricating a nanowire using a meniscus, reference may be made to Korean Patent No. 10-1969844 (Apr. 11, 2019) (entitled "METHOD OF NANOWIRE CONNECTED OPTICAL FIBER") (hereinafter referred to as "Prior Art 2") (refer to FIG. 2).

Prior Art 2 discloses a method of fabricating a nanowire (having a nanometer-sized diameter) at the tip of an optical fiber using a pipette (having a tip with a micrometer-sized diameter). In this method, the difference between the tip diameter of the pipette and the nanowire diameter to be fabricated is large, and hence, as shown in FIG. 2, it is essential to form a meniscus stretched to nano scale at the pipette tip. In addition, in order to fabricate a nanowire having a given diameter, it is essential to keep the constant shape and size of the meniscus. Nevertheless, it is also difficult for Prior Art 2 to obtain a nanowire having a designed diameter, and Prior Art 2 does not disclose a control method for fabricating the nanowire while keeping the meniscus constant, that is, how to regulate the pulling speed of the pipette.

SUMMARY

An object of the present disclosure is to provide an efficient method for fabricating a micro/nano wire, which may facilitate precise and easy control of the positions, shapes and diameters of three-dimensional polymer micro/nano wires, regardless of not only the types and concentrations of polymer solutions but also external environmental factors.

The present disclosure for achieving the above object discloses a method of fabricating a micro/nanowire having a nanometer- to micrometer-sized diameter on an object at predetermined positions. The method comprises: preparing a micro/nanopipette having a tip with an inner diameter ($d_{pt}$) of the tip which is substantially the same as the diameter of the micro/nanowire to be fabricated; filling the micro/nanopipette with a solution containing a micro/nanowire-forming material; bringing the solution at the tip of the micro/nanopipette into contact with the object; and pulling the micro/nanopipette apart from the object at a pulling speed lower than or equal to a predetermined critical pulling speed ($v_c$) to fabricate a micro/nanowire having substantially the same diameter as the inner diameter ($d_{pt}$) of the tip of the micro/nanopipette Wherein the critical pulling speed ($v_c$) is defined by a maximum limit of the pulling speed at which the micro/nanowire to be fabricated has the same diameter as the inner diameter ($d_{pt}$) of the tip of the micro/nanopipette. Therefore, when the pulling speed is lower than the critical pulling speed, a micro/nanowire having the same diameter as the inner diameter ($d_{pt}$) of the tip of the micro/nanopipette is fabricated, and when the pulling speed is higher than the critical pulling speed, a micro/nanowire having a diameter different from the inner diameter ($d_{pt}$) of the tip of the micro/nanopipette is fabricated.

In one embodiment of the present disclosure, the critical pulling speed ($v_c$) is inversely proportional to the inner diameter ($d_{pt}$) of the tip of the micro/nanopipette.

In addition, the critical pulling speed ($v_c$) is proportional to the concentration of the micro/nano wire-forming material in the solution.

In addition, the critical pulling speed ($v_c$) is determined in inverse proportion to the n/2 square of the molecular weight (M) of the micro/nano wire-forming material, where n is a value determined experimentally according to the type of molecule of the micro/nano wire fabrication material.

In addition, the critical pulling speed ($v_c$) is determined by $$v_c = \frac{a}{d_{pt}} = \frac{1}{d_{pt}} \cdot \frac{kC}{\sqrt{M^n}},$$

wherein $\alpha$ is $$\frac{kC}{\sqrt{M^n}},$$

k is a constant determined by the micro/nano wire-forming material and environmental factors during the fabrication of the micro/nano wire, C is the concentration of the micro/nano wire fabrication material in the solution, M is the molecular weight of the micro/nano wire fabrication material, and n is a value determined experimentally according to the type of molecule of the micro/nano wire fabrication material.

In addition, the method further comprises separating the micro/nano wire from the tip of the micro/nano pipette by increasing the pulling speed of the micro/nano pipette.

In addition, silicon, an optical fiber, or any device or structure having any nanometer to micrometer size can be applied as a substrate object for growing the micro/nano wire, and the micro/nano wire can be fabricated on a flat or curved surface, an edge, a corner, a vertex, or a cone-shaped tip of the object.

In addition, the micro/nanowire-forming material comprises at least one of: a hydrophobic polymer selected from the group consisting of Polystyrene, Poly(lactic acid) (PLA), Poly(caprolactone) (PCL), PEDOT:PSS, Polystyrene-co-maleic acid, Poly(methyl methacrylate), Polycarbonate, Polyurethane, Polyvinylpyrrolidone (PVP), and Polyvinylidene Fluoride (PVDF), a hydrophilic polymer selected from the group consisting of Poly(acrylic acid) (PAA), Polyacrylamide (PAM), Polystyrene sulfonate (PSS), Poly (vinyl alcohol) (PVA), an organic conductive polymer (i-conjugated polymer), a nucleic acid selected from the group consisting of DNA and RNA, a protein selected from the group consisting of Bovine Serum Albumin (BSA), Streptavidin, Gelatin, Collagen, and various enzymes and antibodies, and a polysaccharide selected from the group consisting of Starch, Dextran, Glycogen, Cellulose, Alginate, Chitosan, and Carrageenan.

In addition, a solvent for dissolving the micro/nanowire-forming material comprises: at least one of DI water, dimethyl sulfoxide (DMSO), dimethylformamide (DMF), toluene, xylene, tetrahydrofuran (THF), ethanol, chloroform; and any material capable of dissolving the micro/nanowire-forming material.

In another embodiment of the present disclosure, the critical pulling speed ($v_c$) is determined by utilizing a volume fraction ($\varphi_0$) of the micro/nanowire-forming material in the solution.

In addition, the critical pulling speed ($v_c$) is determined by $$v_c = \frac{a}{d_{pt}} \left( \text{here, } a = 4xE \frac{\phi_0}{\phi_{wet} - \phi_0} \right),$$

wherein $d_{pt}$ is the inner diameter of the tip of the micro/nanopipette; x is an axial length of a wet solid region of the micro/nanowire fabricated; E is an evaporation flux of a solvent; $\varphi_{wet}$ is a volume fraction of a solute in the wet solid region; and $\varphi_0$ is a volume fraction of the solute in the solution filled in the micro/nanopipette, and wherein the wet solid region is a region in which the remaining solvent, though evaporation is almost done, is still evaporating from the surface of the solution after the solidification of at least a portion of the solution withdrawn from the tip of the micro/nanopipette.

In addition, the method further comprises regulating the pulling speed of the micro/nanopipette to be higher than the critical pulling speed ($v_c$) in order to fabricate a micro/nano wire having a diameter lower than the inner diameter ($d_{pt}$) of the tip of the pipette.

DETAILED DESCRIPTION

Figure 1:
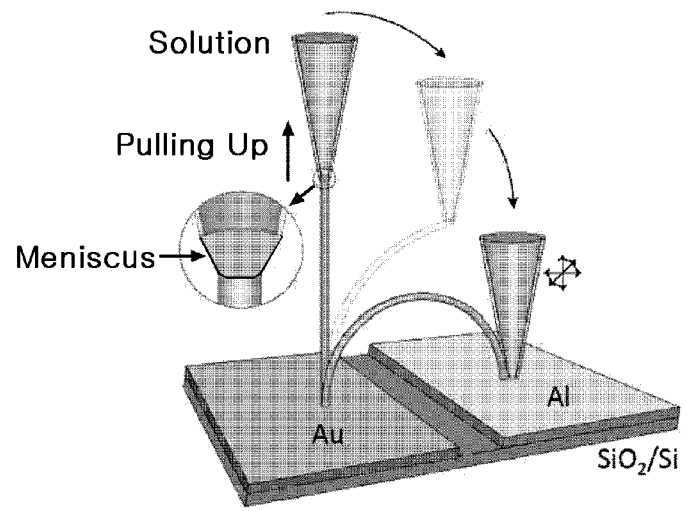
FIG. 1 is a view showing a nanowire fabricating method according to Prior Art 1.
Figure 2:
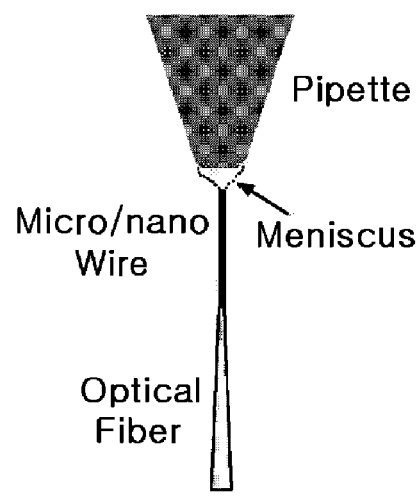
FIG. 2 is a view showing fabricating a nanowire at the tip of an optical fiber by forming a meniscus at the tip of a pipette according to Prior Art 2.

Hereinafter, preferred embodiments of a method of fabricating a micro/nano wire at predetermined position on an object using a micro/nano pipette according to the present disclosure will be described with reference to the accompanying drawings. For reference, the terms referring to each component in the present disclosure are terms defined in consideration of the functions of the components, and thus it should not be understood that the technical content of the present disclosure is predicted and limited by the terms themselves. In addition, in the present disclosure, singular expressions include plural expressions unless specified otherwise in the context thereof.

The present disclosure discloses a method of fabricating a micro/nano wire having a nanometer- to micrometer-sized diameter at predetermined position on an object. The method includes: preparing a micro/nano pipette having a tip with a nanometer- to micrometer-sized diameter, particularly an inner diameter of the tip is substantially the same as the diameter of the micro/nano wire to be fabricated; filling the micro/nano pipette with a solution diluted with a micro/nano wire-forming material (solute); bringing the solution into contact with the object surface by contacting the tip of the micro/nano pipette to the object surface; and pulling one or both of the micro/nano pipette and the object at a speed lower than or equal to a predetermined critical pulling speed to fabricate a micro/nano wire having a diameter which is substantially the same as the inner diameter of the tip of the micro/nano pipette and is uniform during growth. The method further includes stripping away the fabricated micro/nano wire from the tip of the micro/nano pipette by instantly increasing the pulling speed of the micro/nano pipette after the micro/nano wire is fabricated up to a predetermined length.

Here, the critical pulling speed ($v_c$) is the maximum limit of the pulling speed at which the micro/nano wire to be fabricated has the same diameter as the tip diameter of the micro/nano pipette, and therefore when the pulling speed is lower than the critical pulling speed, a micro/nano wire having the same diameter as the tip diameter of the micro/nano pipette is fabricated, and when the pulling speed is higher than the critical pulling speed, a micro/nano wire having a diameter different from the tip diameter of the micro/nano pipette, particularly with a diameter smaller than the tip diameter, is fabricated.

As used herein, the expression "pulling one or both of the micro/nano pipette and the object" includes moving both the micro/nano pipette and the object closer to each other or away from each other; moving the object in a state in which the micro/nano pipette is fixed; or moving the micro/nano pipette in a state in which the object is fixed. In particular, the present disclosure describes that the micro/nano pipette is moved upward in a state in which the object is fixed at the lower side. In particular, the present disclosure describes that the tip of the micro/nano pipette is brought into contact with the object by moving the micro/nano pipette downward in a vertical direction in a state in which the object is fixed at the lower side and then the micro/nano pipette is pulled upward in the vertical direction, whereby the micro/nano wire extending from the object in the vertical direction is fabricated.

As used herein, the term "object" may include any/all objects. For example, the term "object" may include a substrate formed of silicon and other materials, an optical fiber, or any nanometer- to micrometer-sized device or structure.

In addition, the micro/nano wire may be fabricated at any predetermined position of the object. For example, the micro/nano wire may be fabricated at any predetermined position such as on a flat or curved surface, an edge, a corner, a vertex, or a horn-shaped tip. In addition, the micro/nano wire may be fabricated not only in a linear (straight) shape, but also in any three-dimensional curved shape.

1. PRINCIPLES AND PROBLEMS OF EXISTING MENISCUS-GUIDING METHODS

When a pipette filled with a solution in which a micro/nano wire fabrication material (solute) is diluted in a volatile liquid material (solvent) is pulled upward (lifting) at a predetermined pulling speed (v) after the contact of the pipette tip to an object, a micro/nano wire is produced by rapid solidification of the micro/nano wire fabrication material in the solution flowed out from the tip of the pipette.

Specifically, the solvent rapidly evaporates from the surface of the solution while the solute does not evaporate. Therefore, as time passes, after the solvent mostly evaporates, a wet solid region (refer to FIG. 3a) in which the ratio of the solute in the solution is very high is formed. The wet solid region is a region in which the remaining solvent, though evaporation is almost done, is still rapidly evaporating from the surface of the solution while the remaining solute maintains the shape of the micro/nano wire. This wet solid region can be observed as a hard gel with a little solvent kept therein. When the solvent completely evaporates from the wet solid region, a solid micro/nano wire is fabricated.

Meanwhile, the solution inside the pipette is mostly composed of a liquid solvent containing a low concentration of the solute, and the solvent in the solution starts to evaporate immediately as soon as the solution is withdrawn from the tip of the pipette. Accordingly, a transition region (refer to FIG. 3a) is formed between the tip of the pipette and the wet solid region (refer to Langmuir, 28(1), pp. 200-208).

Figure 3A:
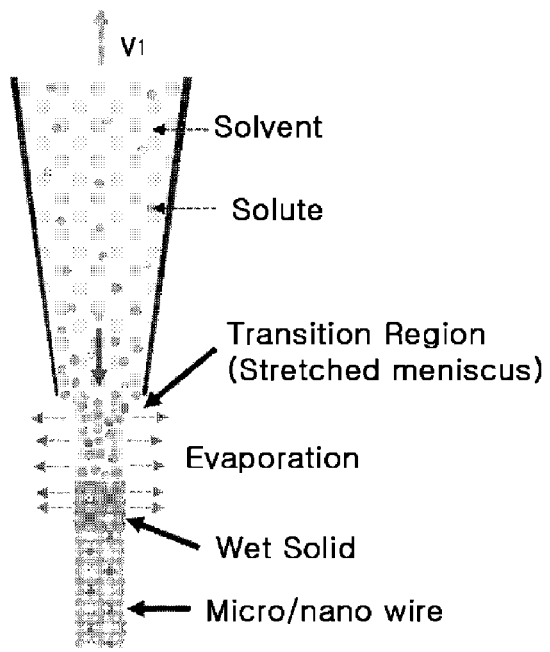
FIGS. 3a and 3b are the views showing the fabrication of a micro/nano wire under a non-confined and a confined growth conditions, respectively.

During producing the micro/nano wire, the transition region greatly affects the growth behavior of the micro/nano wire. When the pulling speed ($v_1$) of the pipette is sufficiently fast, so that the withdrawal rate of the solution (or the amount of outflow) from the tip of the pipette is faster than the evaporation rate (or the amount of evaporation) of the solvent in the withdrawn solution, as shown in FIG. 3a, a transition region which can be regarded as a mixture of liquid and solid phases. In this transition region, a meniscus is formed by the surface tension of the solution. The meniscus is then stretched by pulling the pipette and the diameter of the micro/nano wire is determined by the diameter of the stretched meniscus.

However, the stretching degree of the meniscus varies depending on the type of material or the surrounding environment during the formation of the micro/nano wire, accordingly, inevitably changing the diameter of the micro/nano wire even under the same pulling speed. In addition, until the diameter of the micro/nano wire reaches its equilibrium value, it is unavoidable that the diameter is gradually decreased from the diameter of the tip of the micro/nano pipette.

2. COMPOSITION OF THE PRESENT INVENTION: CONFINED GROWTH AND NON-CONFINED GROWTH

When preparing a micro/nano wire having a micro/nano scale diameter, the amount (or rate) of solution flowed out from the tip of the pipette varies according to the pulling speed at which the pipette is lifted. The growth behavior of the wire may vary according to the relationship between the rate (or amount) of flowing out of the solution and the rate (or amount) of evaporation of the solvent from the flowed solution.

Figure 3B:
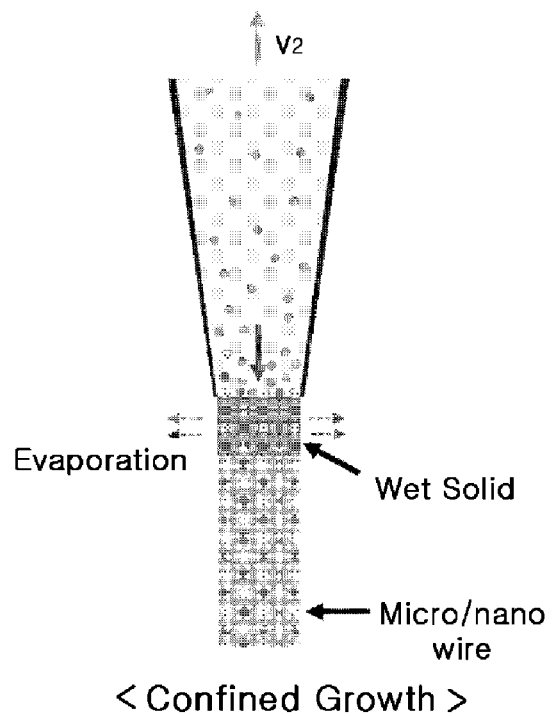

In the micro/nano wire manufacturing process, when the pulling speed ($v_2$) of the pipette is sufficiently low, and thus the solvent in the flowed-out solution is immediately evaporated as soon as the solution is flowed out from the tip of the pipette, so that the withdrawal rate of flowing of the solution is synchronized to the evaporation rate of the solvent, as shown in FIG. 3b, the transition region becomes negligibly small and the meniscus is not formed, that is, the withdrawal solution immediately changes into a wet solid state without a transition region, followed by its immediate change into a solid micro/nano wire. In this case, the micro/nano wire is grown in a state in which the shape of the wet solid region is confined by the shape of the tip of the pipette. In particular, in this case, the diameter ($d_w$) of the micro/nano wire is determined by the inner diameter ($d_{pt}$) of the tip of the pipette. The micro/nano wire having almost the same diameter as the inner diameter of the pipette tip is fabricated ($d_w \approx d_{pt}$). Therefore, it is possible to grow micro/nano wire with a desired constant diameter at all time, regardless of the type of material (solute and solvent) constituting the solution or the surrounding environment. As the diameter of the formed wet solid is limited by the inner diameter of the pipette tip, this growth is defined as a confined growth (refer to FIG. 3b). Meanwhile, in conventional methods such as a 'probe-based drawing' or a 'meniscus-guiding' based on stretching of a solution, the formation of a wet-solid region is not confined by the inner diameter of the pipette tip, and thus the growth in conventional methods is defined as a non-confined growth (refer to FIG. 3a).

In summary, a high pipette pulling speed results in non-confined growth. On the other hand, if the pulling speed is low, confined growth is expected. From this, it is conceivable that there may be a critical pulling speed ($v_c$) that distinguishes the confined and the non-confined growths.

The present invention intends to grow a micro/nano wire under conditions of confined growth, and has the advantageous effect of easily regulating the diameter of the micro/nano wire (in other words, it has the merit in which the diameter of the micro/nano wire is determined by the same diameter as the inner diameter of the micro/nano pipette tip). As long as the confined growth condition is satisfied, there is an advantage that the diameter of the micro/nano wire does not change depending on the type of material constituting the solution or the surrounding environment but is confined only to the inner diameter of the micro/nano pipette tip.

3. MATERIALS THAT CAN BE USED TO FABRICATE MICRO/NANO WIRES

In the present invention, the solute materials for fabricating micro/nano wires may include most of organic materials. In particular, it may be a hydrophobic polymer selected from the group consisting of Polystyrene, Poly(lactic acid) (PLA), Poly(caprolactone) (PCL), PEDOT:PSS, Polystyrene-co-maleic acid, Poly(methyl methacrylate), Polycarbonate, Polyurethane, Polyvinylpyrrolidone (PVP), and Polyvinylidene Fluoride (PVDF). Alternatively, it may be a hydrophilic polymer selected from the group consisting of Poly(acrylic acid) (PAA), Polyacrylamide (PAM), Polystyrene sulfonate (PSS), Poly(vinyl alcohol) (PVA), and an organic conductive polymer. Alternatively, it may be a nucleic acid selected from the group consisting of DNA and RNA. Alternatively, it may be a protein selected from the group consisting of Bovine Serum Albumin (BSA), Streptavidin, Gelatin, Collagen, and various enzymes and antibodies. Alternatively, it may be a polysaccharide selected from the group consisting of Starch, Dextran, Cellulose, Alginate, Chitosan, and Carrageenan.

Meanwhile, as the solvent for diluting the solute materials as described above, at least one of Water, DMSO, DMF, Toluene, Xylene, THF, Ethanol, and Chloroform may be used. It may even include any and all substances capable of dissolving the micro/nano wire fabrication material.

4. SIMULATION OF CONFINED GROWTH METHODS (1) Calculation of Critical Pulling Speed ($v_c$)

(a) Calculation Method of the Critical Pulling Speed ($v_c$) Using Volume Fraction of Solute in Solution As described above, the growth behavior of the micro/nano wire shows a confined growth when the pulling speed of the pipette is lower than the critical pulling speed ($v_c$), and shows a non-confined growth when the pulling speed is higher than $v_c$. Accordingly, it is essential to calculate the critical pulling speed ($v_c$) of the pipette which distinguishes the growth behaviors of the micro/nano wires.

In general, a transition region exists between the withdrawal solution from the tip of the micro/nano pipette and the wet solid region. However, when the micro/nano pipette is pulled away at a speed below the critical pulling speed, the transition region is very small and can be ignored. When the solvent evaporates from the surface of a wet solid, the concentration of solvent vapor at the surface is defined by Fick's 2nd law as:

$$\frac{\partial \phi}{\partial t} - D\nabla^2 c = 0 \quad (1)$$

In this case, c corresponds to the vapor concentration of the solvent, and D is the diffusion coefficient, which is affected by the type of solvent and the temperature and humidity of the surrounding environment.

Here, if it is assumed that the solvent evaporates rapidly from the surface of the wet solid, and the vapor concentration (c) of the solvent quickly reaches a steady-state in the gas region of the surrounding environment adjacent to the surface of the wet solid, it becomes like this:

$$\nabla^2 c = 0 \quad (2)$$

In reality, it is reasonable to assume that the solvent evaporates quickly due to its very large specific surface area from the wet solid region that forms a micro/nano wire, and the vapor concentration of the solvent also rapidly reaches a steady state in the gas region of the surrounding environment.

In the steady state, the concentration of the solvent on the surface of the wet solid is fixed to the saturated vapor concentration, and at this time, the evaporation flux (E) of the solvent is as follows:

$$E = -D\nabla c \quad (3)$$

Here, given the type of solvent and the temperature and humidity of the surrounding environment, the evaporation flux has a constant value, and the evaporation amount of the solvent per unit time on the surface of the wet solid is as follows:

$$\pi d_{wet} x E \quad (4)$$

where $d_{wet}$ is the diameter of the wet solid region (which can be substituted by the inner diameter of the pipette tip or the diameter of a micro/nano wire), and x corresponds to an axial length of the region where evaporation is taking place or the wet solid region.

While the solvent evaporates from the surface of the wet solid, the solution in the pipette is continuously withdrawn from the tip of the micro/nano pipette. In the present invention, it is considered that the diameter ($d_{wet}$) of the wet solid region, the diameter ($d_w$) of the fabricated micro/nano wire, and the inner diameter ($d_{pt}$) of the tip of the pipette are all substantially the same.

Here, the amount of solution flowed out from the tip of the micro/nano pipette is as follows:

$$\frac{\pi}{4} d_{wet}^2 u \quad (5)$$

Where u corresponds to a speed at which the solution flows from the inside of the pipette towards the tip of the pipette. For reference, the outflow of the solution at the tip of the pipette is caused by pulling the pipette, as well as by the factors inside the pipette such as pressure, diffusion, evaporation, surface tension, capillary action, electro osmotic flow acting on a fluid.

Here, assuming that the amount of the solution flowed out from the tip of the micro/nano pipette and the evaporated amount of the solvent are the same, the following equation is established:

$$\frac{\pi}{4} d_{wet}^2 u = \pi d_{wet} x E \quad (6)$$

In the present invention, in order to allow the solution to be flowed out without clogging at the tip of the micro/nano pipette, a diluted solution having a concentration of less than 10 mg/mL may be used. Therefore, the solution is mostly composed of a solvent, and the volume fraction occupied by the solute in the solution is very small. Accordingly, in the flowed solution, most of the solvent evaporates and a very small portion of the solid-state solute remains to fabricate micro/nano wire. Therefore, it is possible to assume that the amount of the solution flowed out from the tip of the micro/nano pipette is equal to the amount of the evaporated solvent.

In addition, as the solvent evaporates out of a solution which is flowed out from the tip of the pipette, the volume fraction of a solute in the solution increases, and the solution is solidified due to the oversaturation of remaining solute, fabricating a micro/nano wire. Here, the growth rate ($v_w$) of the micro/nano wire, that is, the growth rate ($v_{wet}$) of the wet solid region, satisfies the following relationship (refer to Langmuir, 26(12), pp. 9269-9275 (2010)).

$$u \approx v_{wet} \frac{\phi_{wet} - \phi_0}{\phi_0} \quad (7)$$

Here, $\varphi_{wet}$ corresponds to the volume fraction of the solute in the wet solid region, and $\varphi_0$ corresponds to the volume fraction of the solute in the solution inside the pipette. If equations (7) and (6) are combined, the following equation is established.

$$\frac{\pi}{4} d_{wet}^2 v_{wet} \frac{\phi_{wet} - \phi_0}{\phi_0} = \pi d_{wet} x E \quad (8)$$

Here, when the pulling speed (v) of the pipette is greater than the growth rate ($v_{wet}$) of the wet solid region, a transition region is generated to some extent between the pipette tip and the wet solid region, thereby forming a meniscus, and the diameter of the micro/nano wire varies according to the stretching degree of the meniscus. Meanwhile, if the pulling speed (v) of the pipette is less than the growth rate ($v_{wet}$) of the wet-solid region, the transition region can be negligible so that the wet-solid region reaches the tip of the pipette, and the diameter ($d_{wet}$) of the wet solid region is the same as the inner diameter ($d_{pt}$) of the pipette tip. From these results, the critical pulling speed ($v_c$) that determines the growth behavior of the micro/nano wire can be determined on the basis of the growth rate ($v_{wet}$) of the wet solid region, and the following equation is established.

$$v_c \approx v_{wet} = \frac{4 \times E}{d_{pt}} \frac{\phi_0}{\phi_{wet} - \phi_0} \quad (9)$$

Equation (9) can be simply expressed from $d_{pt}$, which is a major variable related to the diameter of the micro/nano wire, and the coefficient α, which is determined by other factors as follows:

$$v_c = \frac{a}{d_{pt}}, \left(\text{here, } a = 4 \times E\left(\frac{\phi_0}{\phi_{wet} - \phi_0}\right)\right) \quad (10)$$

According to Equation (10), $d_{pt}$ (=the inner diameter of the pipette tip; the inner diameter of the pipette tip may be the same as the diameter of the pipette tip) is an important variable in determining the critical pulling speed ($v_c$). α is an experimental coefficient determined by the surrounding environment in which the micro/nano wire is manufactured, the types of materials constituting the solution, and the concentration of the solution, and the like. Here, $$a = 4 \times E\left(\frac{\phi_0}{\phi_{wet} - \phi_0}\right)$$

is merely the most basic model as an example, and may be modified according to the external field of the micro/nano wire manufacturing process, such as the temperature, humidity, electric field, and atmospheric pressure.

(b) Calculation Method of the Critical Pulling Speed ($v_c$) Using Molecular Weight and Concentration of Solute The volume fraction of the solute in the solidified micro/nano wire (≈volume fraction of the solute in the wet solid region, $\varphi_{wet}$) is very large compared to that in the dilute solution ($\varphi_0$). Therefore, α in Equation (10) can be expressed as follows:

$$a \approx 4 \times E \frac{\phi_0}{\phi_{wet}} \quad (11)$$

Further, in a dilute solution, the volume fraction ($\varphi_0$) of the solute and the concentration (C) of the solute has a proportional relationship. Therefore, the following relationship can be defined as follows:

$$a \propto \phi_0 \propto C \quad (12)$$

Meanwhile, the relationship between the viscosity of the solution and the growth rate of the wet solid region, or the relationship between the critical pulling speed ($v_c$) and the molecular weight (M) of the solute can be obtained as below.

$$x \propto \frac{1}{\sqrt{\eta}} \quad (13)$$

That is, the length (x) of the region along which the solution withdrawn from the pipette tip evaporates is inversely proportional to the root value of the viscosity (η) of the solution. (refer to Langmuir, 26(12), 9269-9275 (2010)).

In addition, the following relationship is established between the viscosity of the solution and the molecular weight of the micro/nano wire fabrication material, according to the power law (Mark-Houwink relation). (refer to J. Am. Chem. Soc., 73, 1904-1908 (1951), Macromolecules, 20 (9), 2226-2237 (1987))

$$\eta \propto M^n \quad (14)$$

From Equation (11), Equation (13), and Equation (14), the following relation can be obtained.

$$a \propto \frac{1}{\sqrt{\eta}} \propto \frac{1}{\sqrt{M^n}} \quad (15)$$

Here, n is a value experimentally determined according to the type of the polymer and the solvent of the micro/nano wire fabrication material.

By substituting equations (12) and (15) into equation (10), the following relation can be obtained.

$$v_c = \frac{a}{d_{pt}} = \frac{1}{d_{pt}} \cdot \frac{kC}{\sqrt{M^n}} \quad (16)$$

Here, $$a = \frac{kC}{\sqrt{M^n}},$$

where k is a constant determined by the type of the solute (i.e., the micro/nano wire fabrication material) and environmental factors during the manufacture of the micro/nano wire.

Using this relation, it is possible to determine the critical pulling speed ($v_c$) on the basis of the molecular weight of the micro/nano wire fabrication material and the concentration of the solution selected for the formation of the micro/nano wire. That is, by regulating the pulling speed to be below the critical pulling speed ($v_c$), it is possible to fabricate a micro/nano wire having a uniform diameter coinciding with the diameter ($d_{pt}$) of the pipette.

Meanwhile, the coefficient ($\alpha$) calculated using the volume fraction as above (refer to equation (10)) can be considered to be the same as the coefficient ($\alpha$) calculated using the concentration and molecular weight (refer to equation (16)), as represented by the following equation:

$$a = 4 \times E \frac{\phi_0}{\phi_{wet} - \phi_0} = \frac{kC}{\sqrt{M^n}} \quad (17)$$

Therefore, it is possible to regulate the growth of micro/nano wire by establishing process parameters in the micro/nano wire manufacturing process on the basis of the above relationship.

(c) Simulation of Critical Pulling Speed ($v_c$)

Figure 4:
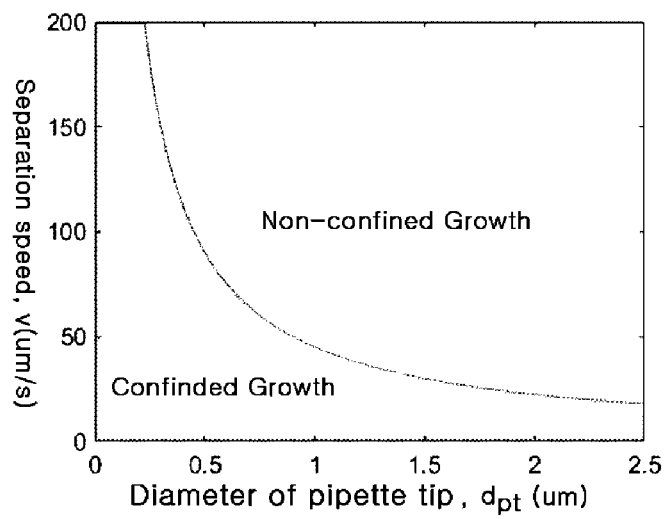
FIG. 4 is a phase diagram showing confined and non-confined growths depending on the critical pulling speed and the tip diameter of a micro/nano pipette.

FIG. 4 shows the simulation result for the micro/nano wire growth behavior according to the tip diameter and the pulling speed of the pipette for a 200 μM concentration of bovine serum albumin (BSA) protein solution. The critical pulling speed ($v_c$) of the pipette that distinguishes the confined growth and the non-confined growth is inversely proportional to the diameter ($d_{pt}$) of the pipette tip.

When the pulling speed of the pipette is greater than the critical pulling speed ($v > v_c$), a transition region and thus its meniscus are formed as described above and the meniscus is stretched by pulling the pipette, resulting in non-confined growth. In this case, the diameter of the micro/nano wire that is determined by the diameter of the stretched meniscus will change depending on the pulling speed.

Meanwhile, when the pulling speed of the pipette is less than or equal to the critical pulling speed ($v \leq v_c$), confined growth occurs and the micro/nano wire with a constant diameter (the same as the diameter of the pipette tip) will grow regardless of the pulling speed. The present invention relates to the growth of micro/nano wires by confined growth, in which the diameter of the micro/nano wires can be easily regulated by controlling the tip diameter of the micro/nano pipette.

Figure 5A:
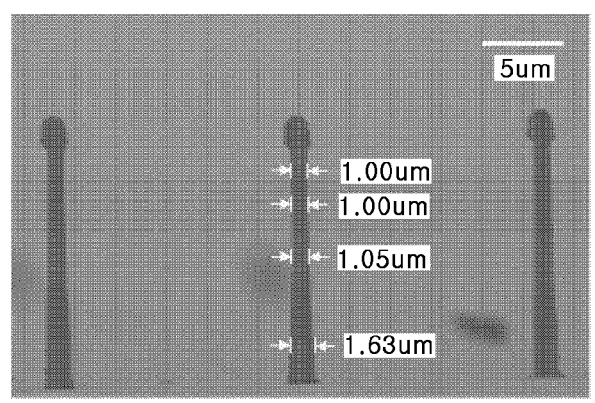
FIGS. 5a and 5b depict the scanning electron microscope (SEM) images showing the morphology of micro/nano wires fabricated under non-confined and confined growth conditions, respectively.
Figure 5B:
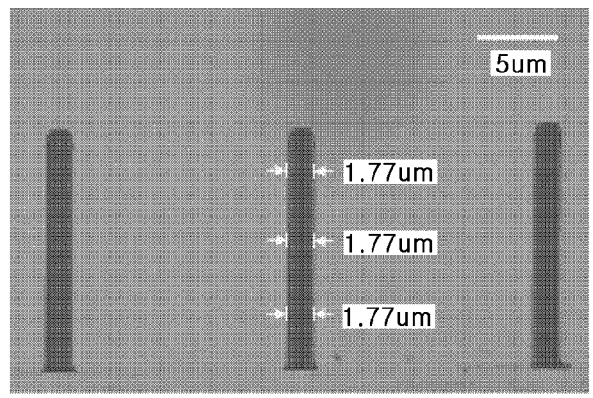

5. EMBODIMENTS OF THE INVENTION (1) Example 1. Non-Confined Growth and Confined Growth Depending on Pipette Pulling Speed FIGS. 5a and 5b show SEM images of the microwires fabricated in a direction perpendicular to a substrate using a solution containing 200 μM of bovine serum albumin (BSA) protein. A pipette having a tip diameter ($d_{pt}$) of 1.77 μm was used for fabrication of each of the micro wire shown in FIG. 5a and FIG. 5b. Referring to the simulation results shown in FIG. 4, the critical pulling speed ($v_c$) of the pipette is 25.5 μm/s for a pipette with a tip diameter ($d_{pt}$) of 1.77 μm.

First, FIG. 5a shows the case in which the pipette was pulled at 75 μm/s, higher speed than $v_c$. According to the simulation, the pulling speed corresponds to the condition of non-confined growth. In fact, it can be seen that, under this condition, the diameter of the micro wire gradually decreased from 1.63 μm at the beginning of growth and then converged to 1.00 μm. This indicates that when the meniscus or the transition region is present, the diameter of the micro/nanowire gradually decreases ($d_w < d_{pt} = 1.77\mu$) due to the meniscus stretching induced by pulling the pipette.

Meanwhile, FIG. 5b shows the case in which the pipette was pulled at 7.5 μm/s lower than $v_c$. According to the simulation, this pulling speed corresponds to the condition of confined growth. In fact, the microwire fabricated under this condition had a constant diameter of 1.77 μm throughout the growth thereof, and this diameter had the same value as the tip diameter of the pipette $d_{pt} = 1.77$ μm. This suggests that, as predicted in the simulation, the micro/nano wire was grown by confined growth. Under the condition of confined growth, it becomes easy to regulate the diameter of a micro/nano wire. That is, the diameter of the micro/nano wire can be determined by the tip diameter of the pipette.

Figure 6A:
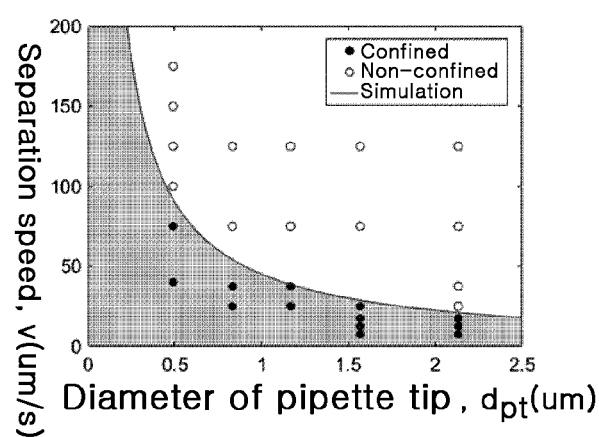
FIGS. 6a and 6b depict diagrams showing the growth behavior (confined or non-confined growth) of BSA protein micro/nano wires and their diameters, respectively, depending on the pipette tip diameter and the pipette pulling speed.
Figure 6B:
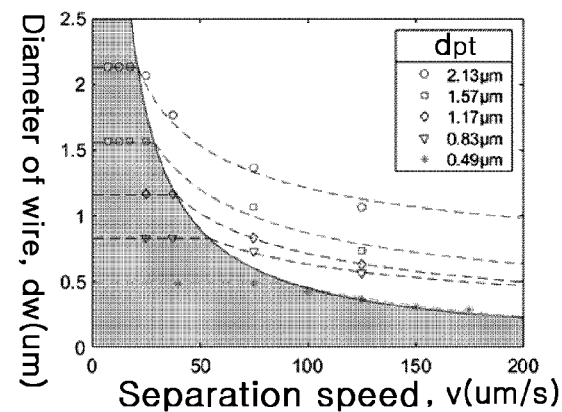

(2) Example 2. The Growth Behavior of the BSA Protein Micro/Nano Wire Depending on Pipette Diameter and Pipette Pulling Speed FIGS. 6a and 6b show the growth behavior of the BSA protein micro/nano wires depending on the tip diameter and the pulling speed of the pipettes, fabricated using a solution containing 200 μM BSA protein. In FIGS. 6a and 6b, the curves indicate the critical pulling speed ($v_c$) determined by the simulation.

FIG. 6a clearly shows that confined growth (solid dots) always occurs under the condition of $v < v_c$ regardless of the pipette diameters, while non-confined growth (empty dots) under the condition of $v > v_c$. These results agree very well with the predictions obtained by simulation.

The diameter of the BSA protein micro/nano wire has a constant value equal to the diameter of the pipette tip in the confined growth region (dark background), but decreases in the non-confined growth region (bright background) as the pulling speed increases. FIG. 6b shows the diameters of the micro/nano wires grown depending on the pulling speed for several tip diameters of the pipettes. In fact, it can be seen that, as the pulling speed increases, the diameter of the micro/nano wire has a constant value ($= d_{pt}$) in the confined growth region (dark background), but gradually decreases in the non-confined growth region (bright background). Under the condition of confined growth, it becomes easy to regulate the diameter of the micro/nano wires. FIGS. 6a and 6b show that the diameter of the micro/nano wire is easily regulated under the conditions of the confined growth.

Figure 7A:
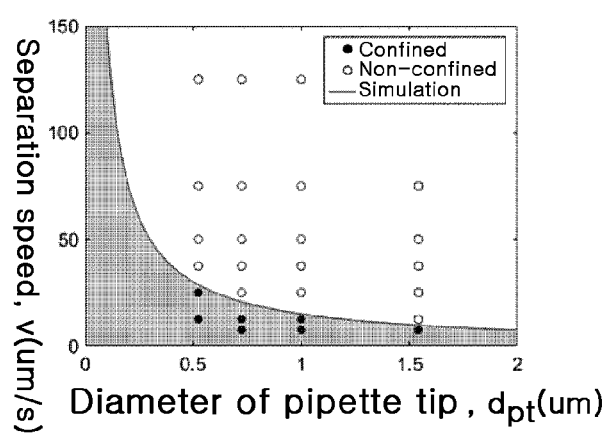
FIGS. 7a and 7b depict diagrams showing the growth behavior (confined or non-confined growth) of DNA micro/nano wires and their diameters, respectively, depending on the pipette tip diameter and the pipette pulling speed.
Figure 7B:
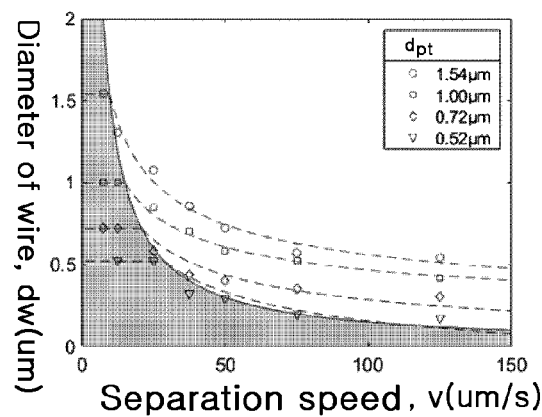

(3) Example 3. The Growth Behavior of the DNA Micro/Nano Wire Depending on Pipette Diameter and Pipette Pulling Speed FIGS. 7a and 7b show the growth behavior of the DNA micro/nano wires depending on the tip diameter and the pulling speed of the pipettes, fabricated using a solution containing 100 μM of DNA. In FIGS. 7a and 7b, the curves indicate the critical pulling speed ($v_c$) determined by simulation. Like FIGS. 6a and 6b, FIGS. 7a and 7b clearly show that, as predicted in simulation, the DNA micro/nano wires grow by confined growth (dark background) for $v<v_c$ but by non-confined growth (bright background) for $v>v_c$.

Under the condition of confined growth, it becomes easy to regulate the diameter of the micro/nano wires.

(4) Example 4. Derivation of Critical Pulling Speed Analysis of Micro/Nano Wire Growth Behavior According to Concentration, Molecular Weight, and Molecular Type of Biopolymers If the growth behavior of the micro/nano wires is estimated on the basis of the above-mentioned description, it is possible to establish conditions for uniformly manufacturing micro/nano wires with desired diameters regardless of the type, concentration, and molecular weight of the biopolymers.

Figure 8A:
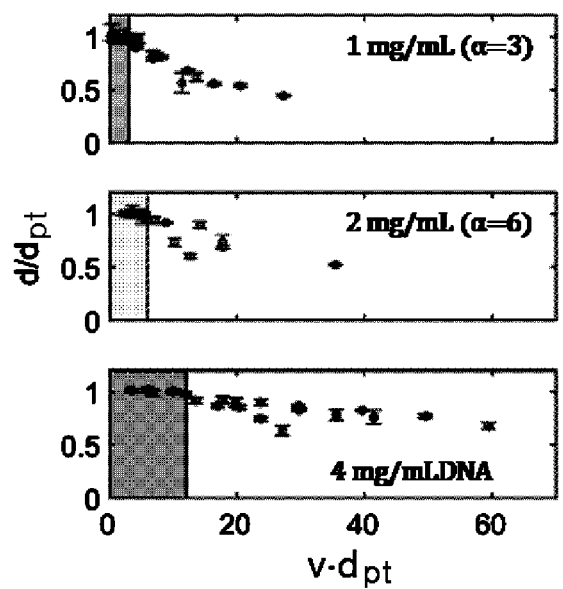
FIGS. 8a, 8b, and 8c are the views showing the growth behaviors of the micro/nano wires prepared according to the concentration of the DNA material solution (1, 2, 4 mg/mL ssDNA), the molecular weight (9.2, 18.7, 36.9 kDa ssDNA), and the type of the biopolymer material (DNA, BSA, Dextran), respectively.
Figure 8B:
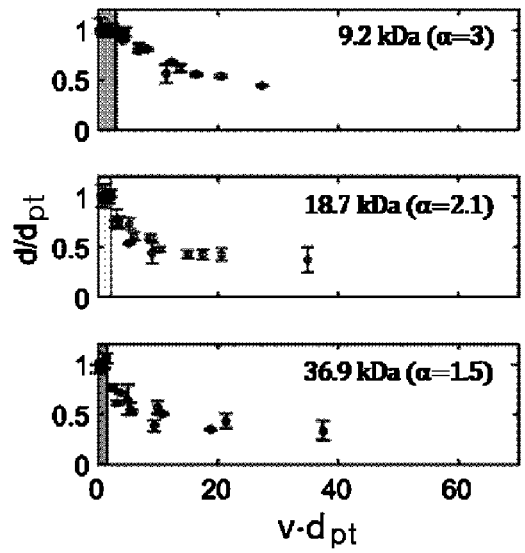
Figure 8C:
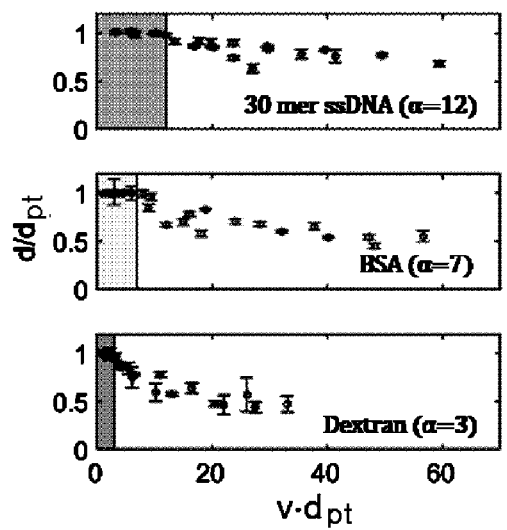

For example, FIGS. 8a-c shows the growth behavior of the micro/nano wire fabricated according to the concentration (1, 2, 4 mg/mL ssDNA) (FIG. 8a) and the molecular weight (9.2, 18.7, 36.9 kDa ssDNA) of DNA (FIG. 8b), and the type of the material (DNA, BSA, Dextran) (FIG. 8c).

In FIGS. 8a-c, the diameter of the DNA micro/nano wire is represented by a normalized diameter ($d/d_{pt}$) as a function of $v \cdot d_{pt}$. It can be observed that $d/d_{pt}$ does not change converging to 1 due to confined growth for sufficiently low pulling speed but gradually decreases from certain pulling speed (higher than certain value) due to non-confined growth.

Here, the critical pulling speed ($v_c$) can be experimentally derived from the point where $d/d_{pt}$ started to be lower than 1, and the experimental constant (α) values can be also obtained under various conditions of the concentration of the polymer material solutions, and the molecular weight of the polymer materials.

Figure 9:
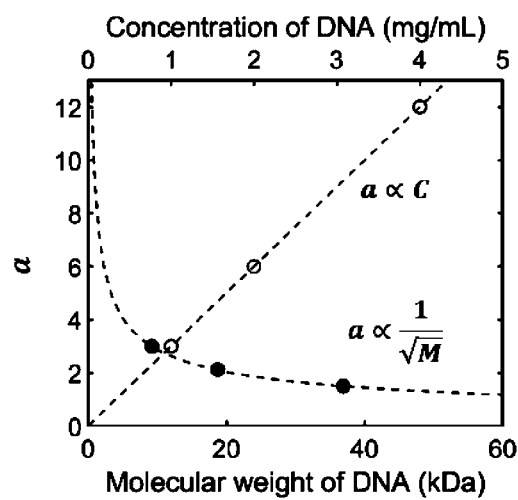
FIG. 9 is a graph showing the relationships between α and the concentration or α and the molecular weight of the DNA. Here a values are determined from the data of FIGS. 8a-c.

Next, FIG. 9 is a graph showing the dependence of the α value, as obtained from FIGS. 8a-c, on the concentration of DNA solution and the molecular weight of DNA. Here, it can be confirmed that the α values (indicated by open or solid circles in FIG. 9) are consistent with the simulation results (indicated by dotted lines in FIG. 9) through the equations derived above. Here, in equation (17), the exponent (n) is a value determined experimentally according to the type of molecule. In this experiment, the simulation result was matched with the results from the micro/nano wires fabricated in FIGS. 8a-c when the value of n was set to 1. These results show that the growth behavior of the micro/nano wires according to the concentration and the molecular weight of DNA can be expected based on the relationship of $$a \propto \frac{C}{\sqrt{M}}.$$

Figure 10:
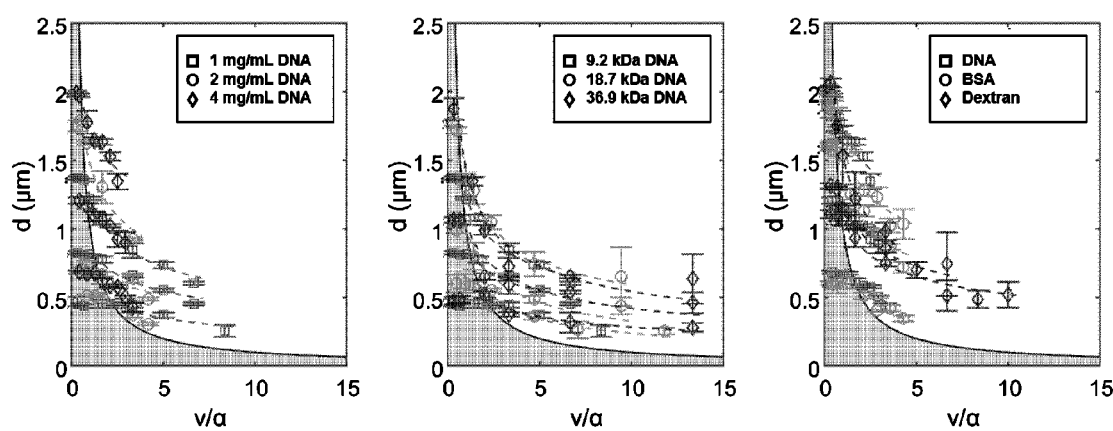
FIG. 10 shows the dependence of the diameter ($d_w$) of the micro/nano wire on the normalized pulling speed (v/a) of the pipette for various DNA concentrations, DNA molecular weights, and types of biopolymer materials.

FIG. 10 is a graph of micro/nano wire diameter ($d_w$) as a function of normalized pulling speed ($v/\alpha$) of a pipette. Here, the inverse proportional curves (solid line) correspond to the normalized critical pulling speed s ($v_c/\alpha$) calculated through the equations derived above. Regardless of the concentrations (1, 2, 4 mg/mL) and the molecular weight (9.2, 18.7, 36.9 kDa ssDNA) of DNA and the types of molecules (DNA, BSA, Dextran), micro/nano wires having uniform diameters were fabricated for $v<v_c$ (dark area). However, for $v>v_c$ (bright region), the diameter of the micro/nanowire decreased with the pulling speed (v).

Figure 11:
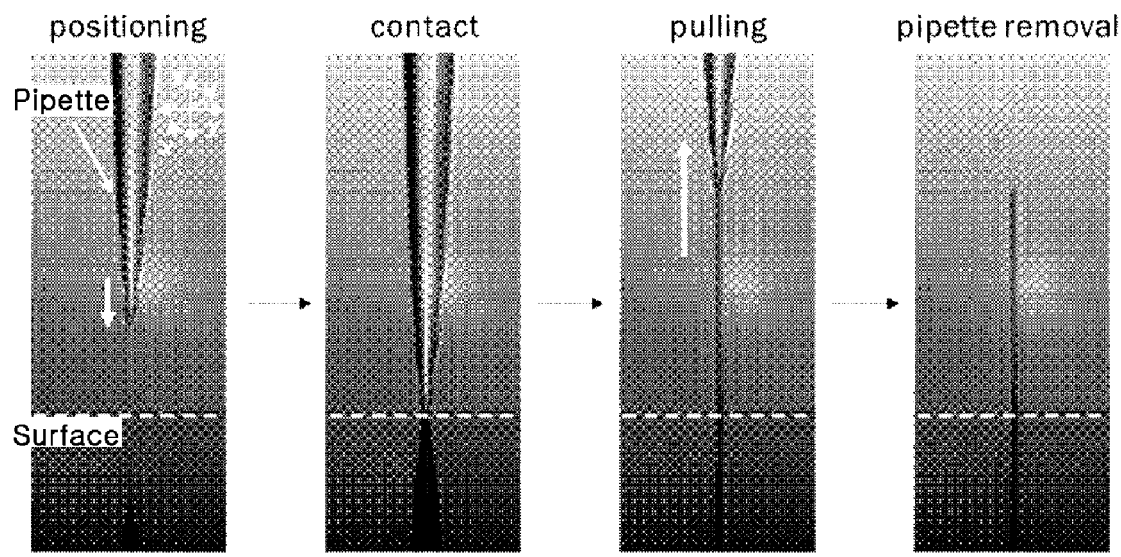
FIG. 11 is optical microscope images showing the fabrication process of a micro/nano wire on a flat object surface using a micro/nano pipette under confined growth condition.
Figure 12:
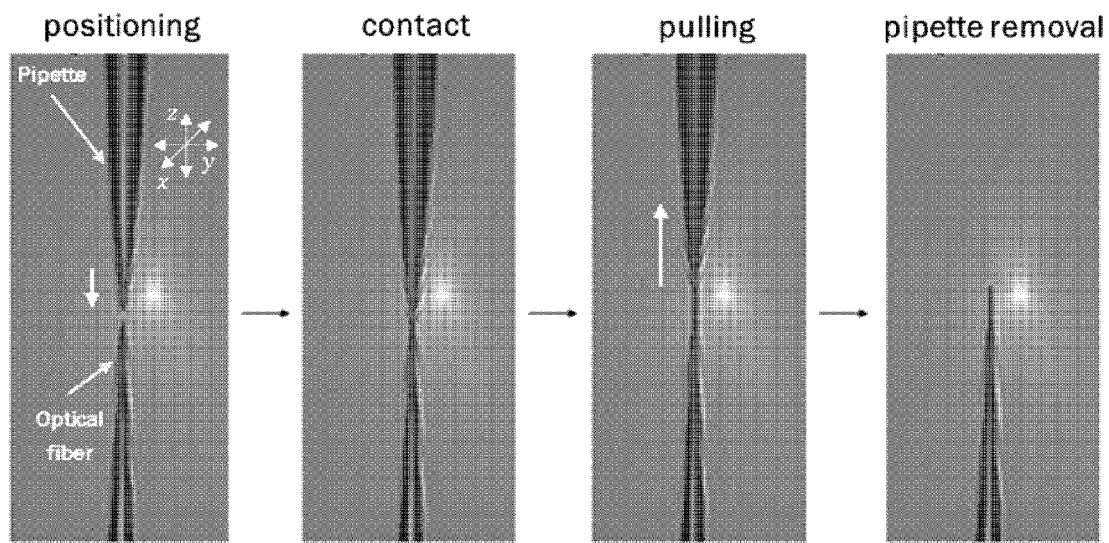
FIG. 12 is optical microscope images showing a fabrication process of a micro/nano wire on a cone-shaped tip of an object using a micro/nano pipette under confined growth condition.

(5) Example 5. Growth of Polymer Micro/Nano Wire by Confined Growth on Si Substrate or Optical Fiber FIGS. 11 and 12 respectively show the manufacturing process of polystyrene polymer micro/nano wire growth on a silicon (Si) substrate and an optical fiber in a confined growth region ($v<v_c$). The method of manufacturing a micro/nano wire according to the present embodiment includes the following steps.

First, a pipette capable of accommodating a material solution for fabricating micro/nano wires in the inside thereof and flowing out the solution through the tip is prepared. In this case, the inner diameter of the pipette tip may be selected to be substantially the same as the diameter of the micro/nano wire to be manufactured.

Then, the pipette is filled with the material solution, and then the pipette is moved to a desired position on the substrate (positioning step).

Next, the tip of the pipette is brought into contact with the surface of an object on which the micro/nano wire is to be manufactured. For example, the pipette is brought into contact with the surface of a silicon substrate (indicated by a dotted line) in FIG. 11 or the end of a tapered optical fiber in FIG. 12 (contact step).

A micro/nano wire is then fabricated by moving the pipette away from the object. At this time, it is preferable to maintain the pulling speed of the pipette such that the micro/nano pipette is pulled away at a speed less than or equal to the critical pulling speed. Then, a micro/nano wire having a diameter substantially equal to the tip diameter of the pipette is fabricated (pulling step).

Further, in other embodiments, the pipette may be moved in a desired direction to obtain desired shape of the micro/nano wire.

Finally, when the micro/nano wire is grown up to a desired length, the fabricated micro/nano wire is separated from the tip of the pipette by pulling the pipette away at a very high speed (pipette removal step).

Figure 13A:
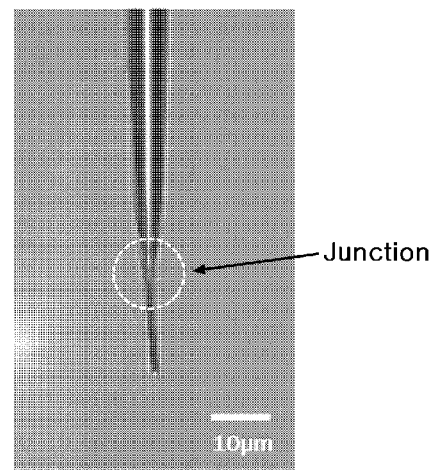
FIGS. 13a and 13b are the bright and dark field images showing the optical coupling efficiency of a micro/nano wire fabricated at the tapered tip of an optical fiber by the method according to the present invention, respectively.
Figure 13B:
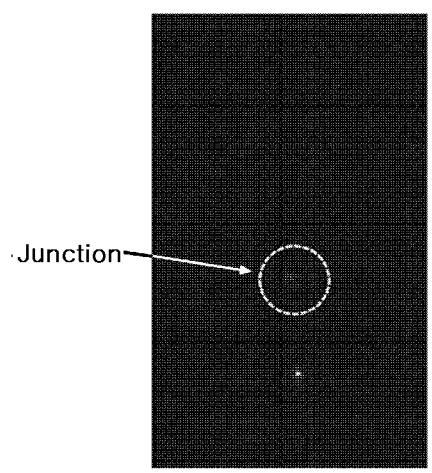

(6) Example 6. Light Transmission of Micro/Nano Wires Grown Under Confined Growth Condition FIGS. 13a and 13b are a bright field (FIG. 13a) and a dark field (FIG. 13b) images, respectively, which show laser light transfer (wavelength=530 nm) through optical fiber to the end of the polystyrene nanowire fabricated on the optical fiber tip. It can be seen from FIG. 13a that the optical fiber and the nanowire are very smoothly connected at the junction (bright dotted circle in FIG. 13a). In addition, as shown in FIG. 13b, light scattering at the junction was almost negligible, indicating that the nanowire fabricated under the confined growth condition, according to the present disclosure, has high optical coupling efficiency.

Figure 14:
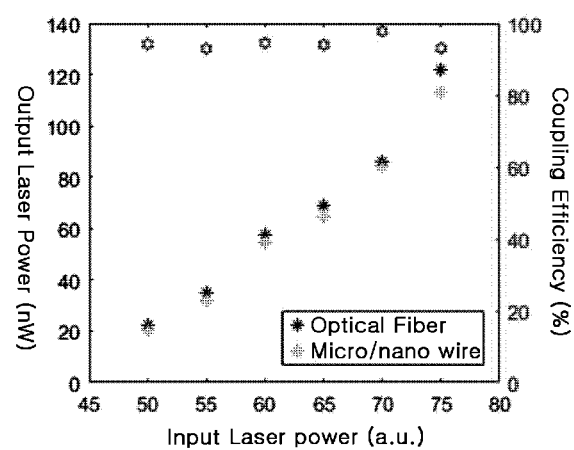
FIG. 14 is a graph showing the optical coupling efficiency of a micro/nano wire prepared by the method of fabricating the micro/nano wire according to the present invention.

FIG. 14 is a graph showing the optical coupling efficiency of the polystyrene micro/nano wire fabricated under the confined growth condition according to the example of the present disclosure. Here, the optical coupling efficiency may be calculated as the ratio of the output laser power between before and after the light is transmitted from the tip of the optical fiber to the micro/nano wire.

The dark stars in FIG. 14 indicate an optical power measured at the optical fiber tip (a tapered optical fiber tip) with no micro/nano wire grown, corresponding to the laser power measured before the light is transmitted to the micro/nano wire.

The lightgray stars in FIG. 14 indicate the optical power measured at the tip of the micro/nano wire grown at the tip of the optical fiber, corresponding to the output laser power measured after the light is transmitted to the micro/nano wire.

In addition, the optical coupling efficiency calculated as the ratio of the laser power between before and after the transmittance of the light to the micro/nano wire is indicated as open dots at the top of the graph.

It is confirmed that the optical coupling efficiency of the micro/nano wire fabricated under the confined growth condition according to the present disclosure is 92% or higher of the total power of the input laser. The high optical coupling efficiency demonstrates that the micro/nano wire fabricated under the confined growth condition is sufficient to be utilized as an optical interconnection.

The micro/nano wire fabricated on the tip of the tapered optical fiber according to the present disclosure has optical coupling efficiency of 90% or higher. Thus, the micro/nano wire fabricated is suitable for use as an optical interconnection for transmitting light from an optical fiber to the micro/nano wire or receiving light from the micro/nano wire to the optical fiber. In addition, the micro/nano wire may be used in an optical sensor that receives light from an optical fiber to the micro/nano wire and transmits the reflected light from the tip of the micro/nano wire or any light generated back to the optical fiber.

The above-described embodiments of the present disclosure are merely illustrative of the technical spirit of the present disclosure, and the scope of protection of the present disclosure should be interpreted by the appended claims. In addition, any person skilled in the art to which the present disclosure pertains will appreciate that various modifications and variations are possible without departing from the essential characteristics of the present disclosure. Thus, all technical ideas within the scope equivalent to the present disclosure should be construed as being included in the scope of the present disclosure.

As described above, the method of fabricating micro/nano wires (microwires and/or nanowires) according to the present disclosure enables precise control of the position and geometry of the micro/nano wires in a three-dimensional space. In addition, the method omits the meniscus formation step which is essential in the conventional method, so that the process is simplified, thus greatly increasing the efficiency of the method. Furthermore, according to the method of the present disclosure, it is easy to regulate the diameter ($d_w$) of the micro/nano wire. Specifically, the diameter of the micro/nano wire may be regulated to be constant ($d_w \approx d_{pt}$) regardless of the type of material or external environmental factors, as long as the condition of confined growth is satisfied.

What is claimed are:

1. A method of fabricating a wire at predetermined positions on an object, the wire having a nanometer-sized or a micrometer-sized diameter, the method comprising:
    preparing a pipette having a tip with an inner diameter ($d_{pt}$), wherein the inner diameter of the tip is a nanometer-sized inner diameter or a micrometer-sized inner diameter;
    filling the pipette with a solution containing a wire-forming material;
    bringing the solution into contact with an object; and
    pulling the pipette apart from the object at a pulling speed lower than or equal to a predetermined critical pulling speed ($v_c$) to fabricate a wire having a nanometer-sized diameter or a micrometer-sized diameter,
    wherein the critical pulling speed ($v_c$) is defined by a maximum limit of the pulling speed at which the wire to be fabricated has a same diameter as the inner diameter ($d_{pt}$) of the tip of the pipette, and therefore when the pulling speed is lower than the critical pulling speed, the wire has substantially a same diameter as the inner diameter ($d_{pt}$) of the tip of the pipette, and when the pulling speed is higher than the critical pulling speed, the wire has a diameter different from the inner diameter ($d_{pt}$) of the tip of the pipette, and
    wherein the critical pulling speed ($v_c$) is proportional to a concentration of the wire-forming material in the solution.

2. The method of claim 1, wherein the critical pulling speed ($v_c$) is inversely proportional to the inner diameter ($d_{pt}$) of the tip of the pipette.

3. The method of claim 1, wherein the critical pulling speed ($v_c$) is determined in inverse proportion to n/2 square of a molecular weight (M) of the wire-forming material, where n is a value determined experimentally according to a type of molecule of the wire-forming material.

4. The method of claim 3, wherein the critical pulling speed ($v_c$) is determined by the following equation:

$$v_c = \frac{a}{d_{pt}} = \frac{1}{d_{pt}} \cdot \frac{kC}{\sqrt{M^n}},$$

wherein $\alpha$ is $$\frac{kC}{\sqrt{M^n}},$$

k is a constant determined by a type of the wire-forming material and environmental factors during formation of the wire, C is a concentration of the micro/nano wire fabrication material in the solution, M is the molecular weight of the wire-forming material, and n is a value determined experimentally according to the type of the wire-forming material.

5. The method of claim 1, wherein the critical pulling speed ($v_c$) is determined by the following equation:

$$v_c = \frac{a}{d_{pt}} = \frac{1}{d_{pt}} \cdot \frac{kC}{\sqrt{M^n}},$$

wherein α is $$\frac{kC}{\sqrt{M^n}},$$

k is a constant determined by a type of the wire-forming material and environmental factors during formation of the wire, C is the concentration of the wire-forming material in the solution, M is a molecular weight of the wire-forming material, and n is a value determined experimentally according to the type of the wire-forming material.

6. The method of claim 1, further comprising: separating the wire from the tip of the pipette by rapidly increasing the pulling speed of the pipette.

7. The method of claim 1, wherein the object is a silicon substrate, an optical fiber, a nanometer-sized device or structure, or a micrometer-sized device or structure, and
   the wire is fabricated on a flat surface, a curved surface, an edge, a corner, a vertex, or a cone-shaped tip of the object.

8. The method of claim 1, wherein the wire-forming material comprises at least one of:
   a hydrophobic polymer selected from the group consisting of Polystyrene, Poly(lactic acid) (PLA), Poly(caprolactone) (PCL), PEDOT:PSS, Polystyrene-co-maleic acid, Poly(methyl methacrylate), Polycarbonate, Polyurethane, Polyvinylpyrrolidone (PVP), and Polyvinylidene Fluoride (PVDF),
   a hydrophilic polymer selected from the group consisting of Poly(acrylic acid) (PAA), Polyacrylamide (PAM), Polystyrene sulfonate (PSS), Poly(vinyl alcohol) (PVA),
   an organic conductive polymer (x-conjugated polymer),
   a nucleic acid selected from the group consisting of DNA and RNA,
   a protein selected from the group consisting of Bovine Serum Albumin (BSA), Streptavidin, Gelatin, Collagen, and various enzymes and antibodies, and
   a polysaccharide selected from the group consisting of Starch, Dextran, Glycogen, Cellulose, Alginate, Chitosan, and Carrageenan.

9. The method of claim 1, wherein a solvent for dissolving the wire-forming material comprises:
   at least one of DI water, dimethyl sulfoxide (DMSO), dimethylformamide (DMF), toluene, xylene, tetrahydrofuran (THF), ethanol, and chloroform.

10. The method of claim 1, wherein the critical pulling speed ($v_c$) is determined by utilizing a volume fraction ($\varphi_0$) of the wire-forming material in the solution.

11. The method of claim 1, wherein the critical pulling speed ($v_c$) is determined by the following equation:

$$v_c = \frac{a}{d_{pt}}, \left(\text{here}, a = 4 \times E \frac{\phi_0}{\phi_{wet} - \phi_0}\right)$$

wherein $d_{pt}$ is the inner diameter of the tip of the pipette; x is an axial length of a wet solid region; E is an evaporation flux of a solvent; $\varphi_{wet}$ is a volume fraction of a solute in the wet solid region; and $\varphi_0$ is a volume fraction of the solute in the solution filled in the pipette, and
wherein the wet solid region is a region in which a remaining solvent is still evaporating from a surface of the solution after solidification of at least a portion of the solution withdrawn from the tip of the pipette.

12. The method of claim 1, wherein, when the pulling speed is higher than the critical pulling speed, the wire has a diameter smaller than the inner diameter ($d_{pt}$) of the tip of the pipette.

13. A method of fabricating a wire at predetermined positions on an object, the wire having a nanometer-sized or a micrometer-sized diameter, the method comprising:
   preparing a pipette having a tip with an inner diameter ($d_{pt}$), wherein the inner diameter of the tip is a nanometer-sized inner diameter or a micrometer-sized inner diameter;
   filling the pipette with a solution containing a wire-forming material;
   bringing the solution into contact with an object; and
   pulling the pipette apart from the object at a pulling speed lower than or equal to a predetermined critical pulling speed ($v_c$) to fabricate a wire having a nanometer-sized diameter or a micrometer-sized diameter,
   wherein the critical pulling speed ($v_c$) is defined by a maximum limit of the pulling speed at which the wire to be fabricated has a same diameter as the inner diameter ($d_{pt}$) of the tip of the pipette, and therefore when the pulling speed is lower than the critical pulling speed, the wire has substantially a same diameter as the inner diameter ($d_{pt}$) of the tip of the pipette, and when the pulling speed is higher than the critical pulling speed, the wire has a diameter different from the inner diameter ($d_{pt}$) of the tip of the pipette, and
   wherein the critical pulling speed ($v_c$) is determined in inverse proportion to n/2 square of a molecular weight (M) of the wire-forming material, where n is a value determined experimentally according to a type of molecule of the wire-forming material.

14. The method of claim 13, wherein the critical pulling speed ($v_c$) is determined by the following equation:

$$v_c = \frac{a}{d_{pt}} = \frac{1}{d_{pt}} \cdot \frac{kC}{\sqrt{M^n}},$$

wherein α is $$\frac{kC}{\sqrt{M^n}},$$

k is a constant determined by a type of the wire-forming material and environmental factors during formation of the wire, C is a concentration of the micro/nano wire fabrication material in the solution, M is the molecular weight of the wire-forming material, and n is a value determined experimentally according to the type of the wire-forming material.

15. A method of fabricating a wire at predetermined positions on an object, the wire having a nanometer-sized or a micrometer-sized diameter, the method comprising:
   preparing a pipette having a tip with an inner diameter ($d_{pt}$), wherein the inner diameter of the tip is a nanometer-sized inner diameter or a micrometer-sized inner diameter;
   filling the pipette with a solution containing a wire-forming material;
   bringing the solution into contact with an object; and
   pulling the pipette apart from the object at a pulling speed lower than or equal to a predetermined critical pulling speed ($v_c$) to fabricate a wire having a nanometer-sized diameter or a micrometer-sized diameter, wherein the critical pulling speed ($v_c$) is defined by a maximum limit of the pulling speed at which the wire to be fabricated has a same diameter as the inner diameter ($d_{pt}$) of the tip of the pipette, and therefore when the pulling speed is lower than the critical pulling speed, the wire has substantially a same diameter as the inner diameter ($d_{pt}$) of the tip of the pipette, and when the pulling speed is higher than the critical pulling speed, the wire has a diameter different from the inner diameter ($d_{pt}$) of the tip of the pipette, and wherein, when the pulling speed is higher than the critical pulling speed, the wire has a diameter smaller than the inner diameter ($d_{pt}$) of the tip of the pipette.

\* \* \* \* \*